United States Patent [19]

Itoh

[11] Patent Number: 5,034,341
[45] Date of Patent: Jul. 23, 1991

[54] METHOD OF MAKING A MEMORY CELL ARRAY STRUCTURE

[75] Inventor: Masahiro Itoh, Tokyo, Japan
[73] Assignee: Oki Electric Industry Co., Ltd., Tokyo, Japan
[21] Appl. No.: 461,998
[22] Filed: Jan. 8, 1990

Related U.S. Application Data

[62] Division of Ser. No. 320,232, Mar. 7, 1989, Pat. No. 4,920,389.

[30] Foreign Application Priority Data

Mar. 8, 1988 [JP] Japan .................. 63-54487

[51] Int. Cl.⁵ .............................. H01L 21/70
[52] U.S. Cl. ........................ 437/52; 437/38; 437/60; 437/203; 437/233; 437/235; 437/919
[58] Field of Search ............... 437/38, 47, 52, 60, 437/203, 919, 191, 193, 195, 233, 235, 228; 357/23.6, 51; 156/643

[56] References Cited

U.S. PATENT DOCUMENTS

| 4,763,180 | 8/1988 | Hwang et al. | 357/23.6 |
|---|---|---|---|
| 4,833,516 | 5/1989 | Hwang et al. | 357/23.6 |

FOREIGN PATENT DOCUMENTS

| 198590 | 10/1986 | European Pat. Off. | |
|---|---|---|---|
| 0057949 | 4/1985 | Japan | 437/67 |
| 0073366 | 4/1986 | Japan | 357/23.6 |
| 0140170 | 6/1986 | Japan | 357/23.6 |
| 0289642 | 12/1986 | Japan | 437/67 |
| 0010557 | 1/1988 | Japan | 357/23.6 |

OTHER PUBLICATIONS

Richardson et al., "A Trench Transistor Cross-Point DRAM Cell", *IDEM*, 1985, pp. 714–717.
*IBM Technical Disclosure Bull.*, "High Density Cross Point Semiconductor Memory Cell", pp. 199–200 (Dec. 1987).

*Primary Examiner*—Olik Chaudhuri
*Assistant Examiner*—Tom Thomas
*Attorney, Agent, or Firm*—Edward D. Manzo

[57] ABSTRACT

This invention relates to a memory cell array structure which comprises a low electric resistance semiconductor substrate and a number of memory cells. Each memory cell includes a capacitor portion and a switching element portion substantially provided thereon. The switching element portion comprises as one constituent region thereof one of electrodes, i.e., the second electrode of the capacitor portion. The second electrodes of all the memory cells are integrated altogether to constitute an integral common electrode which provides a separate region between the memory cells. With such a construction of the memory cell array structure, the area occupied by one memory cell is decreased and the cell-to-cell variation in the capacitor capacity is also decreased. This invention also relates to a process for producing such a memory cell array structure.

22 Claims, 12 Drawing Sheets

FIG_4
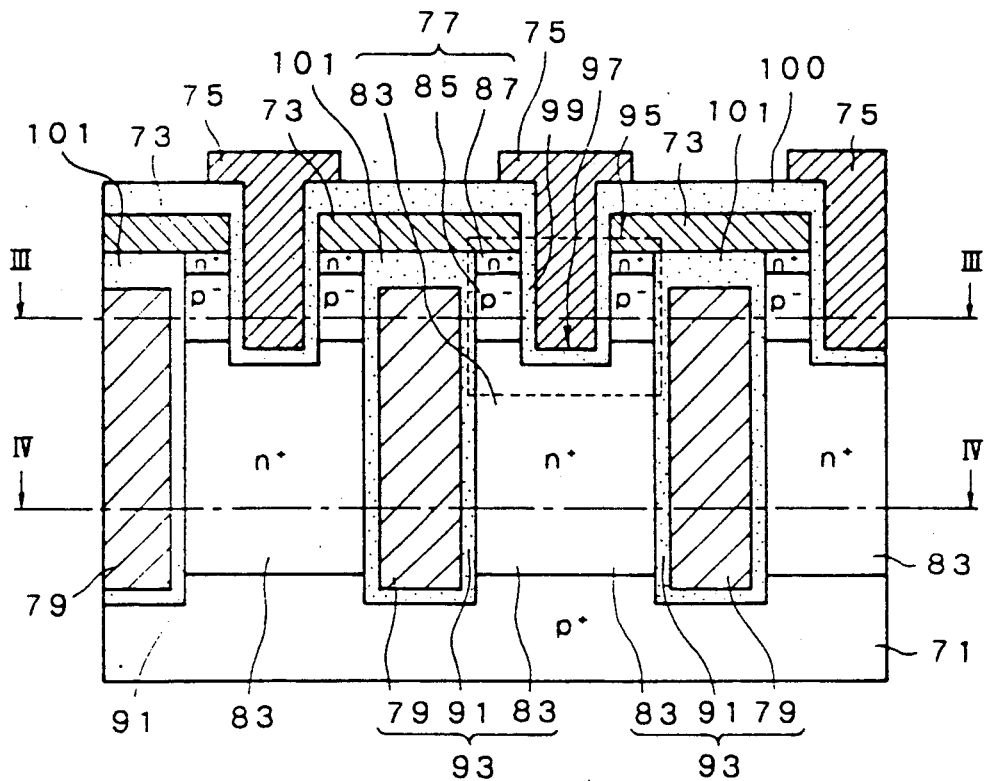
FIG_5
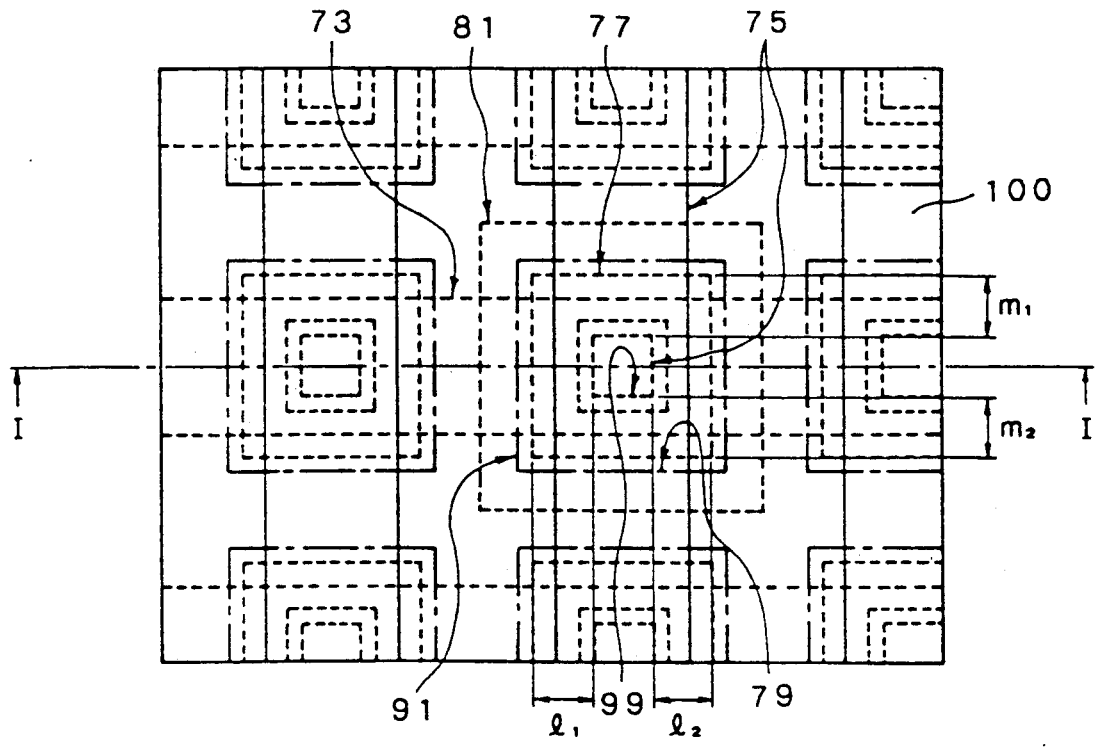

FIG_6
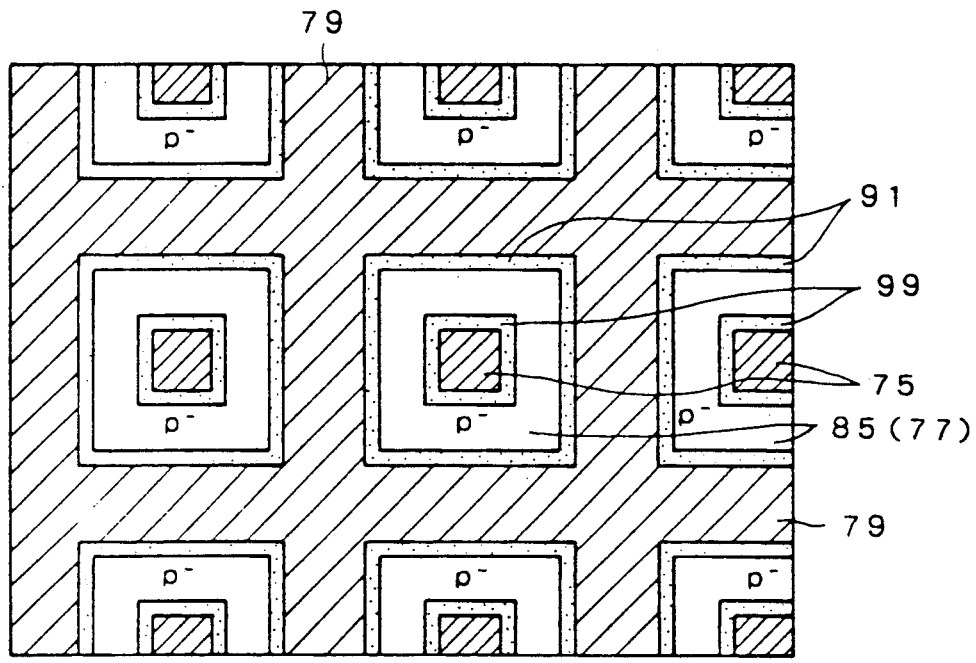
FIG_7
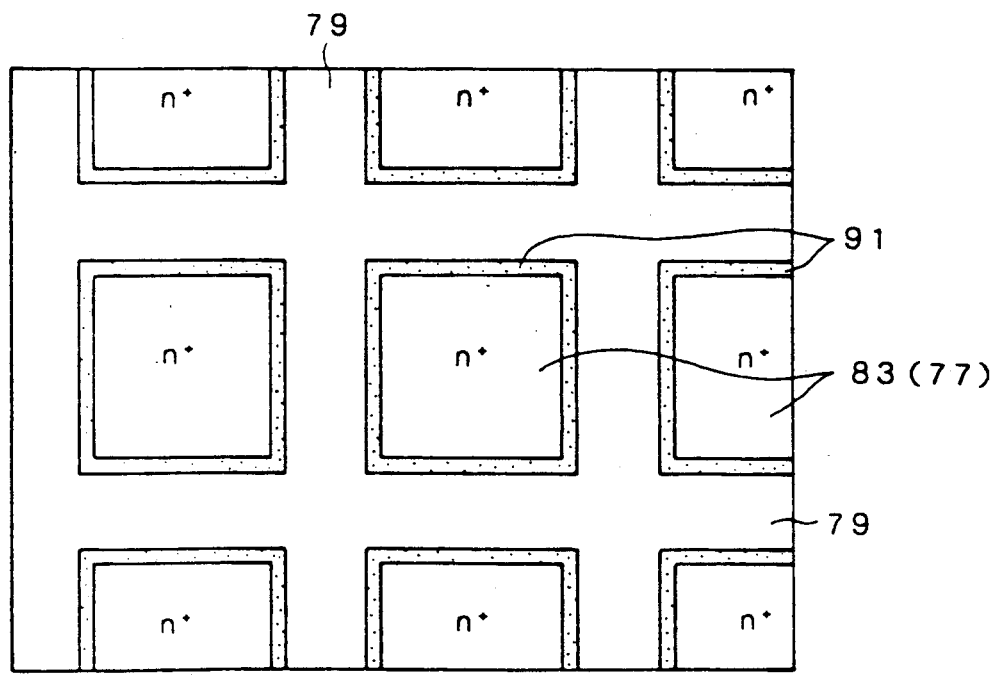

FIG_8(a)
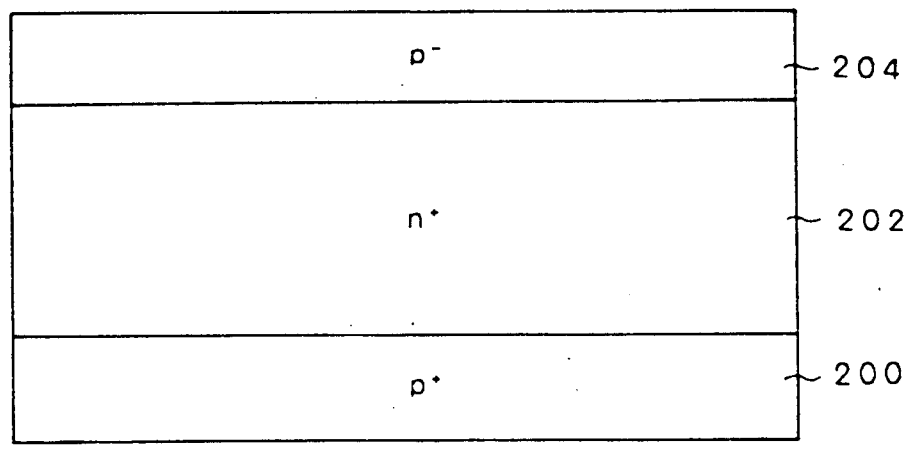
FIG_8(b)
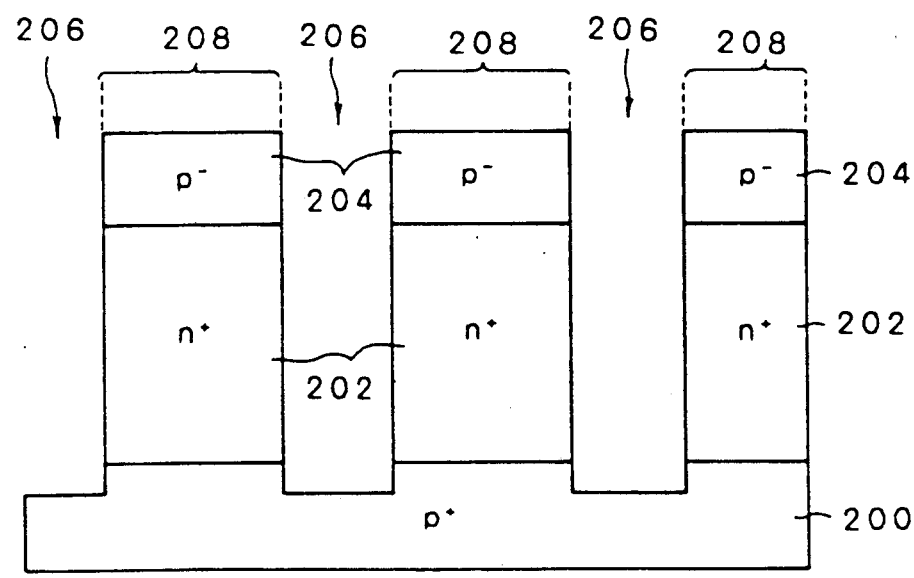

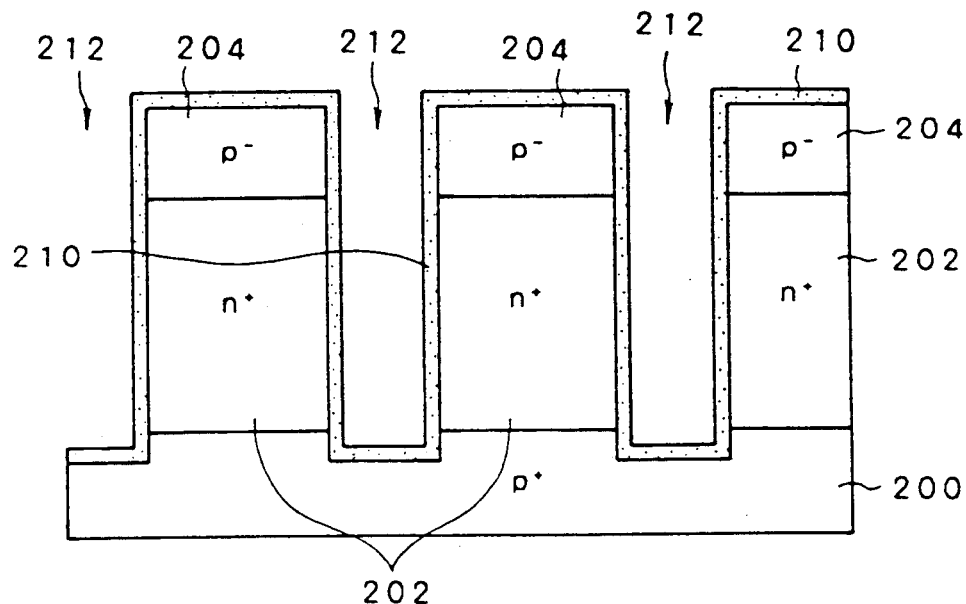
FIG_8(c)
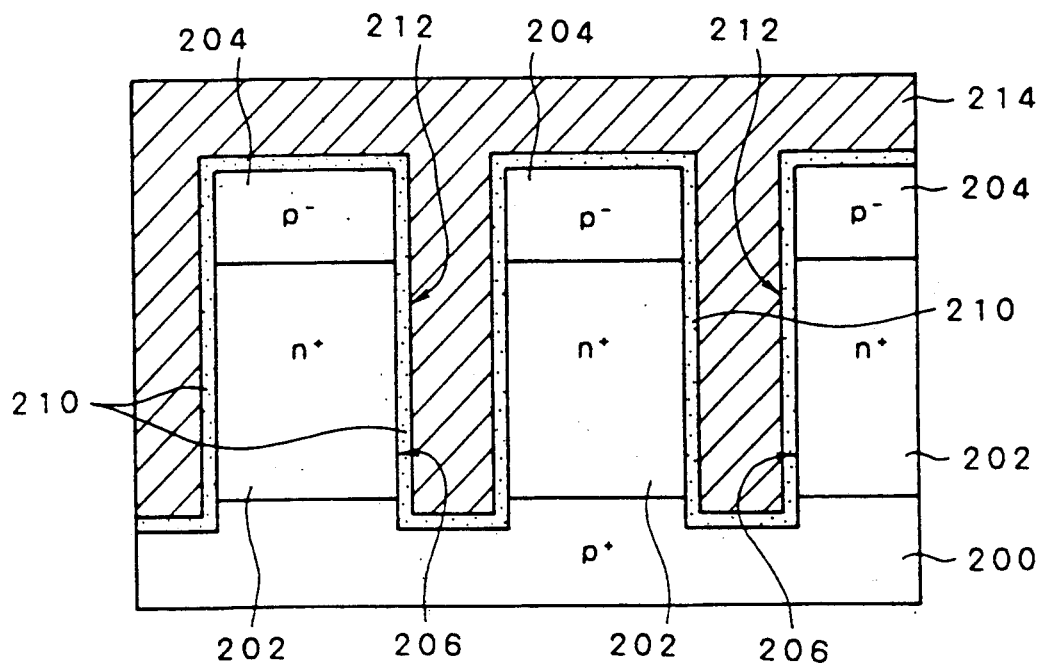
FIG_8(d)

FIG_8(e)
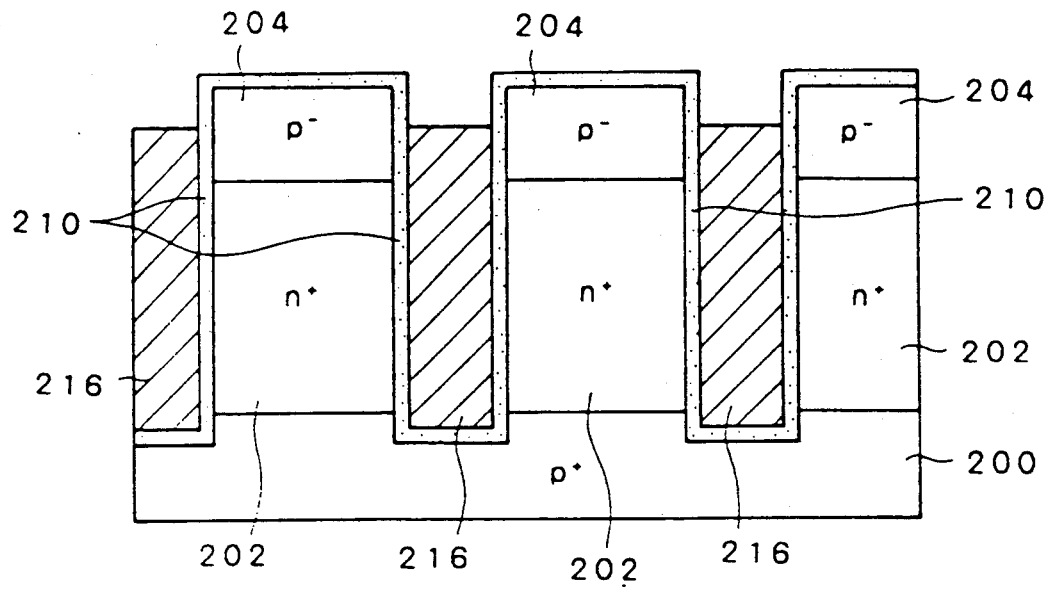
FIG_8(f)
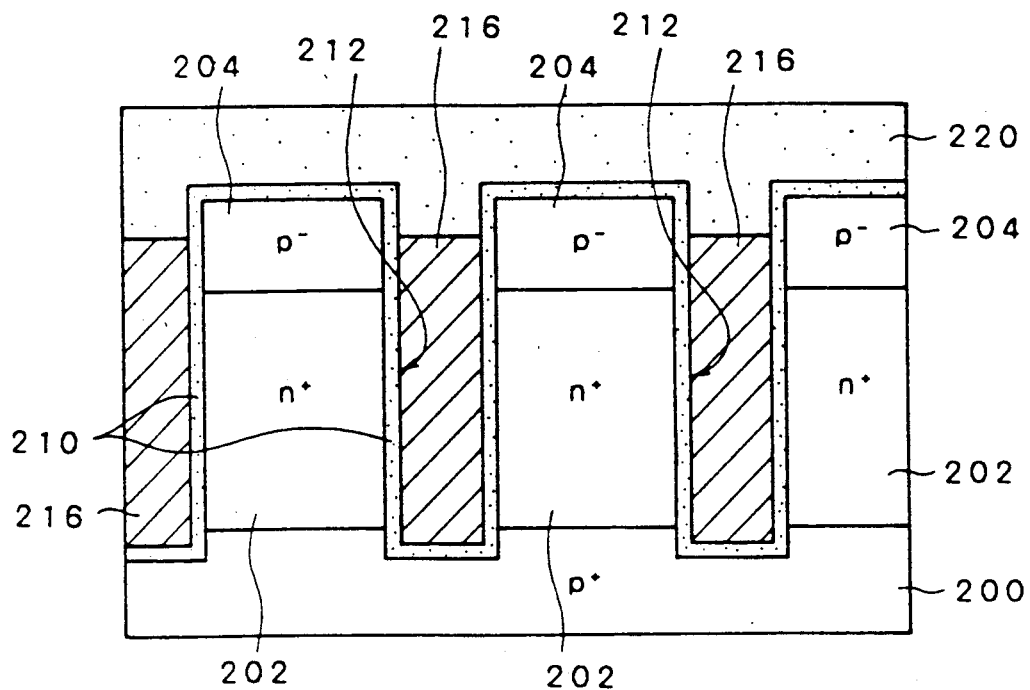

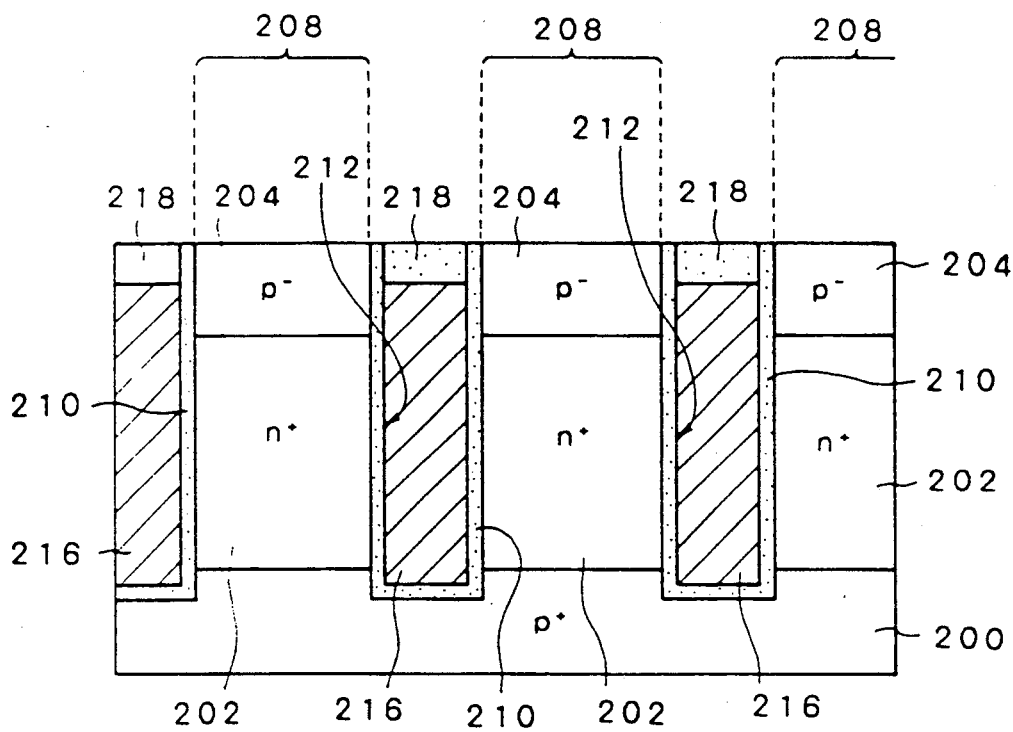
FIG_8(g.)
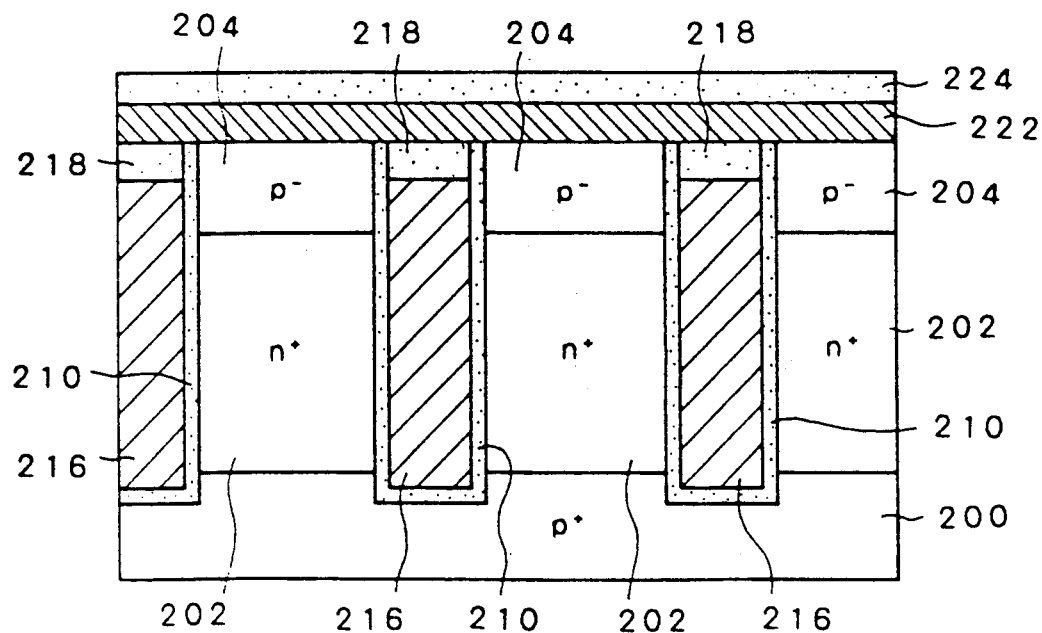
FIG_8(h)

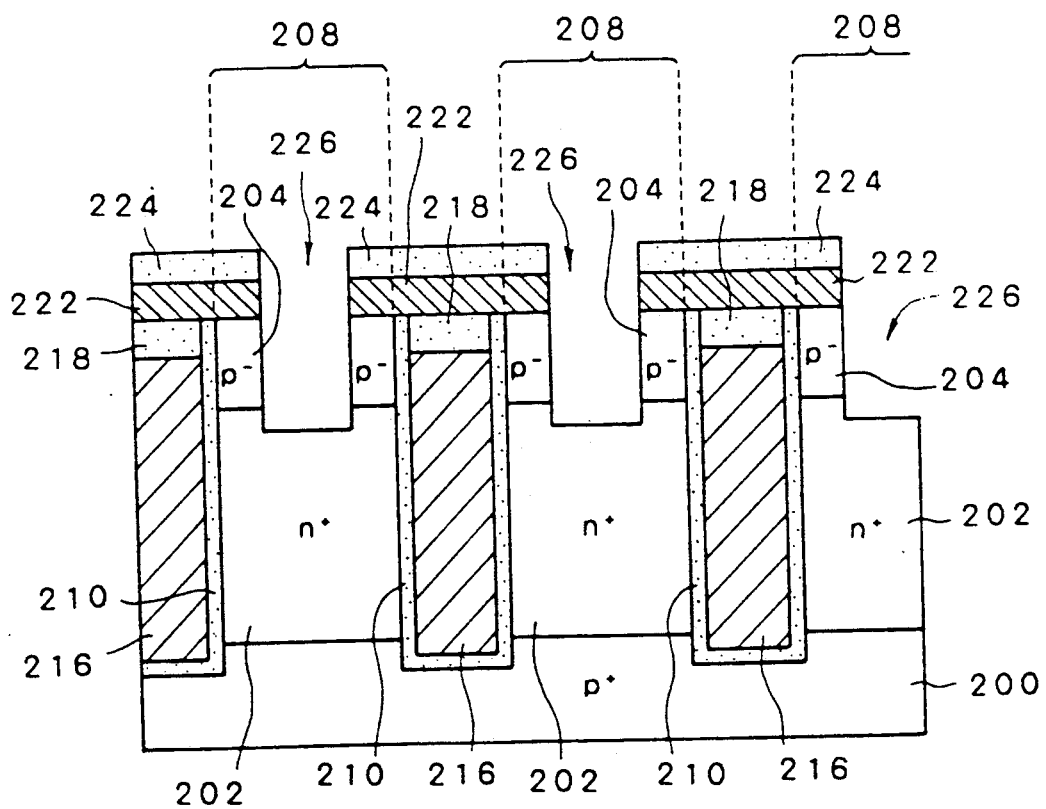
FIG_8(i)

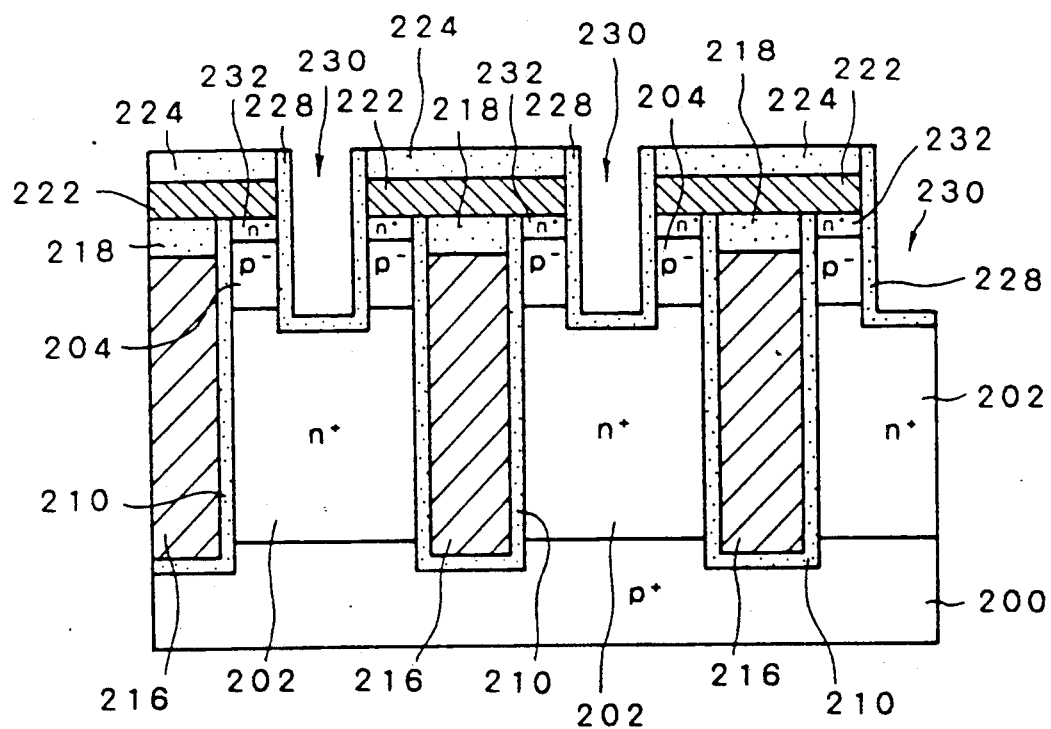
FIG_8(j)

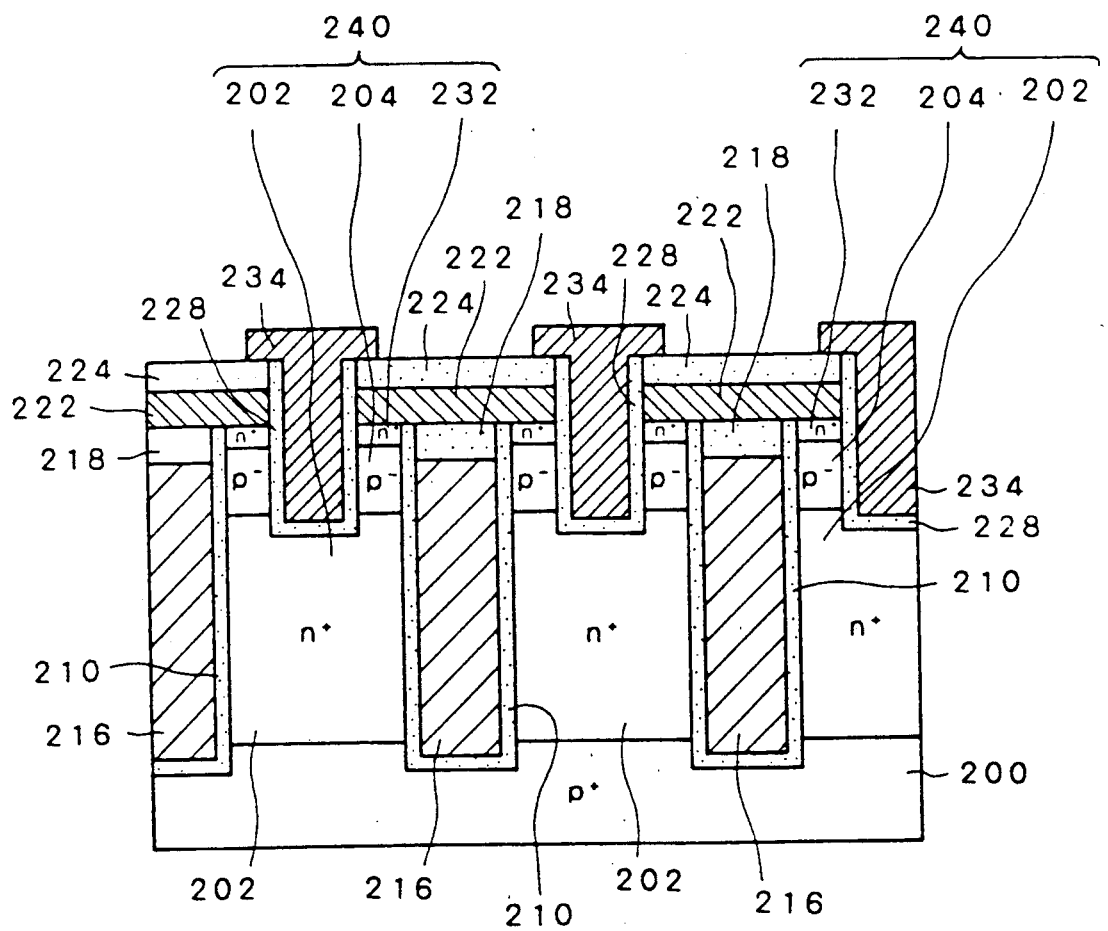
FIG_8(k)

METHOD OF MAKING A MEMORY CELL ARRAY STRUCTURE

This is a divisional of application Ser. No. 320,232, filed on Mar. 7, 1989, now U.S. Pat. No. 4,920,389.

BACKGROUND OF THE INVENTION

1. Field of the Invention

The present invention relates to a memory cell array structure comprising a number of memory cells having a structure adapted to attain a high scale of integration, and to a process for producing the same.

2. Prior Art

A high scale of integration of a memory cell array structure enables various electronic appliances such as information processing appliances to be miniaturized and improved in performance. Accordingly, intensive investigations have been made with a view to scaling up the integration of a memory cell array structure.

A brief description will be made of a few types of memory cell structures incorporated into conventional memory cell array structures of dynamic random access memory (DRAM) type as examples.

Memory cells constituting a memory cell array structure of DRAM type each comprise one switching element and one capacitor. Such memory cells are widely used since they are adapted to attain a high scale of integration. In each such memory cell, a switching transistor is used to store an electric charge in a capacitor or discharge an electric charge from the capacitor to thereby provide a certain level of an electric charge being present in the capacitor, which level corresponds to a certain piece of information.

In general, such a memory cell has a built-in structure wherein a capacitor comprising a silicon substrate, an insulating film (e.g., a silicon oxide film) and a polycrystalline silicon film is juxtaposed in a plan with a MOS transistor around the upper surface of the silicon substrate. In the case of this type of memory cell structure, however, since the area occupied by one memory cell as projected on the reverse surface of a substrate is large, the scale of integration in the production of a memory cell array structure comprising a number of such memory cells is inevitably restricted. Therefore, the above-mentioned type of memory cell structure is not preferable in order to scale up the integration of a memory cell array structure. In view of this, there has heretofore been proposed various memory cell array structures having a three-dimensional structure, such for example as will now be described while referring to FIGS. 1 to 3, wherein hatching to indicate cross sections, and the like are partially omitted to avoid too much complication of the drawings.

FIG. 1 is a schematic cross-sectional view of a conventional memory cell structure adapted to attain a high scale of integration in a memory cell array structure.

This memory cell structure comprises a so-called "trench capacitor" 15 formed by utilizing a trench 13 dug in a silicon substrate 11, and a switching transistor 25 constituted of a drain region 19 connected with a bit line 17, a gate electrode 21 as a word line, and a source electrode (not shown in FIG. 1) connected with the cell plate of the capacitor 15. According to this memory cell structure, the area occupied by the capacitor portion as projected on the reverse surface of the substrate can be decreased to enable a memory cell array structure to be greatly improved in the scale of integration of memory cells incorporated thereinto.

FIGS. 2 and 3 are schematic fragmentary cross sectional views of conventional memory cell array structures comprising a number of memory cells better adapted to attain a high scale of integration.

FIG. 2 shows part of a memory cell array structure as disclosed in Japanese Patent Laid-Open No. 239,658/1986. This memory cell array structure comprises a $p^+$-type silicon substrate 31; a plurality of insular $p^-$-type semiconductor layers 35 provided thereon and separated from one another by a first trench 33 provided therebetween in matrix fashion and having an inner wall face having thereon an insulating layer 39; a capacitor electrode 37 embedded in a second trench formed inside the first trench by the insulating film 39 and ranging from the bottom to part of the height of the second trench; a plurality of $n^-$-type semiconductor layers 41 embedded in lower inner side wall portions of respective insular $p^-$-type semiconductor layers 35 and substantially confronting the capacitor electrode 37 through the insulating film 39 therebetween; a plurality of gate electrodes 43 embedded in the second trench on the upper side of the capacitor electrode 37 with the insulating layer 39 therebetween; a plurality of $n^+$-type semiconductor layers 45 covering the upper surface of the insular $p^-$-type semiconductor layers 35; and $p^-$-type semiconductor regions 47 constituting upper inner side wall portions of the respective insular $p^-$-type semiconductor layers. The capacitor of each memory cell comprises part of the capacitor electrode 37, an $n^-$-type semiconductor layer 41 as a partner capacitor electrode, and part of the insulating film 39, while the switching transistor of each memory cell comprises part of a gate electrode 43, part of an $n^+$-type semiconductor layer 45 as a drain region, a $p^-$-type semiconductor region 47 as a channel region, and a source region (not shown in FIG. 1) connected with the $n^-$-type semiconductor layer 41.

FIG. 3 shows part of a memory cell array structure as disclosed in IEEE, pp. 714–717 (1985). Each memory cell of this memory cell array structure comprises a $p^+$-type semiconductor substrate 51 having a p-type semiconductor layer 52 provided thereon and a trench 53 formed therein; a capacitor electrode 55 embedded in the trench 53 with a thin insulating film 57 therebetween (provided on the inner wall face of the trench 53 and substantially corresponding to the contour of the trench 53) and ranging from the bottom to part of the height of the trench 53; a drain region 59 provided on an upper outer side wall face of the trench 53 with an insulating film 58 therebetween and on the upper side of the p-type semiconductor layer 52; a channel region 61 constituting part of the p-type semiconductor layer 52 and existing along an upper outer side wall face of the trench 53 with the insulating film 58 therebetween but under the drain region 59; a source region 63 provided on an upper outer side wall face of the trench 53 with the insulating film 58 therebetween but under the channel region 61 and embedded in the p-type semiconductor layer 52; and a gate electrode 65 partially inserted into the trench 53 and substantially confronting the channel region 61. The capacitor of each memory cell comprises the capacitor electrode 55 and part of the $p^+$-type semiconductor substrate as a partner capacitor electrode, while the switching transistor of each memory cell comprises the drain region 59, the channel region 61, the source region 63, and the gate electrode 65.

Each memory cell of either one of the memory cell array structures as shown in FIGS. 2 and 3 has a capacitor and a switching transistor so three-dimensionally formed by utilizing a trench, particularly the side wall thereof, as to greatly decrease the area occupied by the memory cell as projected on the upper surface of a substrate. Therefore, the use of such a memory cell structure in the production of a memory cell array structure of DRAM type can attain a higher scale of integration than the use of a memory cell structure as shown in FIG. 1.

In the case of the conventional memory cell array structure as shown in FIG. 2, however, an anisotropic etching technique is employed to form gate electrodes on the inside and along the side walls of the second trench, resulting in a cell-to-cell variation in channel length, which is problematic in that the operational characteristics differ from switching transistor to switching transistor.

The conventional memory cell array structure as shown in FIG. 3 involves not only a problem as mentioned above that differences in the operational characteristics between switching transistors are caused by a cell-to-cell variation in channel length, but also problems that leaks of electric current are liable to occur between adjacent capacitors and that it is not easy to form electroconductive side portions connecting transistor portions with respective capacitor portions.

Further, in either one of the memory cell array structures as shown in FIGS. 2 and 3, the capacity is liable to differ from capacitor to capacitor because of cell-to-cell variations in the depth of trench and the depth of capacitor electrode embedded in a trench.

SUMMARY OF THE INVENTION

The present invention has been made in view of such circumstances. Accordingly, an object of the present invention is to provide a memory cell array structure comprising a number of memory cells having a novel structure adapted to attain a high scale of integration, and a process for producing the same.

In order to attain the above-mentioned object, the present invention provides the following memory cell array structure.

(1) Specifically, in accordance with an aspect of the present invention, there is provided a memory cell array structure comprising a semiconductor substrate and a number of memory cells; wherein the semiconductor substrate is a low electric resistance semiconductor substrate of first conductivity type, and each memory cell includes (A) a capacitor portion comprising a first electrode consisting of an insular low electric resistance semiconductor layer of second conductivity type isolatedly formed on the low electric resistance semiconductor substrate, a second electrode at least confronting the whole side face of the first electrode, and an insulating layer electrically insulating the second electrode from the first electrode and the low electric resistance semiconductor substrate, and (B) a switching element portion comprising the above-mentioned first electrode as one constituent region thereof and the other constituent regions provided on the upper side of the first electrode; and wherein the second electrode of all the memory cells are integrated altogether to constitute an integral common second electrode which provides a matrix-like in-between separatory region between the memory cells.

(2) It is preferable that each switching element portion of the memory cell array structure of the present invention comprise the above-mentioned first electrode; a multi-layer structure thereon having a hole having a depth ranging from the upper surface thereof to at least the uppermost surface of the first electrode and comprising in the following order a high electric resistance semiconductor layer of first conductivity type, a low electric resistance semiconductor layer of second conductivity type, and a third electrode; a fourth electrode provided in a recess formed inside the hole by an insulating layer therebetween; and a side wall face region of the high electric resistance semiconductor layer adjoining a side wall area of the hole.

(3) It also is preferable that the above-mentioned third electrode be integrated into a bit line, and the above-mentioned fourth electrode be integrated into a word line.

(4) It further is preferable that the above-mentioned third electrode be constituted of a polycrystalline silicon layer of second conductivity type.

According to the above-mentioned structure (1), the switching element portions are provided substantially on the respective capacitor portions with the second electrodes serving as the matrix-like in-between separatory region between the memory cells to thereby decrease the area occupied by one memory cell as projected on the reverse surface of the substrate. Further, the cell-to-cell variation in the capacitor capacity can be decreased not only because the thickness of the insular low electric resistance semiconductor layers of second conductivity type can be controlled with a high accuracy according to the recent thin film-forming techniques, but also because the thickness of the insulating layer can be controlled with a high accuracy by forming the insulating layer, for example, through thermal oxidation of an insular low electric resistance semiconductor layer of second conductivity type and a substrate.

According to the above-mentioned structure (2), the channel length can be determined by the thickness of the high electric resistance semiconductor layer of first conductivity type.

According to the above-mentioned structure (3), bit lines and word lines can be formed simultaneously with the formation of the switching element portions.

In the case of the above-mentioned structure (4), a polycrystalline silicon layer of second conductivity type doped with an impurity or dopant may be formed as a third electrode-forming layer directly on high electric resistance semiconductor layers of first conductivity type, into interfacial portions of which in contact with the impurity or dopant contained in the polycrystalline silicon layer is diffused according to solid phase diffusion through a later heat treatment to thereby form a low electric resistance semiconductor layers of second conductivity type (low electric resistance region) in the interfacial portions.

The foregoing memory cell array structure can be produced according to the following process.

Specifically, in accordance with another aspect of the present invention, there is provided a process for producing a memory cell array structure, comprising the steps of:

[a] sequentially forming a low electric resistance semiconductor layer of second conductivity type and a high electric resistance semiconductor layer of first conductivity type on the upper surface of a low electric resistance semiconductor substrate of first conductivity type;

[b] forming a first trench having a depth ranging from the upper surface of the high electric resistance semiconductor layer to at least the upper surface of the substrate in matrix fashion to thereby form a plurality of insular isolated regions of the remaining layers of the two types;

[c] forming a first insulating layer at least on the wall face of the first trench;

[d] forming a first highly electroconductive layer in such a way as to fill up therewith a second recess from inside the trench by the first insulating layer to such a height as to at least reach the height of the remaining high electric resistance semiconductor layers;

[e] forming a second insulating layer on the first highly electroconductive layer formed in the second trench to such a height as to set the upper surface thereof in a level with the upper surface of the high electric resistance semiconductor layer to thereby provide a planer whole upper surface including the upper surface of the remaining high electric resistance semiconductor layers and the upper surface of the second insulating layer;

[f] forming second highly electroconductive layers in stripes fashion on areas of the planar upper surface including at least substantial areas of the upper surfaces of the remaining high electric resistance semiconductor layers in rows between the lines in one direction of the matrix;

[g] forming in the insular isolated regions respective holes having a depth ranging from the upper surface of the second highly electroconductive layer to at least the upper surfaces of the respective low electric resistance semiconductor layer;

[h] forming third insulating layers on the inner wall faces of the respective holes;

[i] converting surface portions of the remaining high electric resistance semiconductor layers of first conductivity type in the respective insular isolated regions into respective low electric resistance semiconductor regions of second conductivity type;

[j] forming third highly electroconductive layers in striped fashion on areas of the uppermost surface positioned on the upper side of at least substantial areas of the insular isolated regions in columns between the lines in the other direction of the matrix through a fourth insulating layer therebetween electrically insulating the third highly electroconductive layers from the second highly electroconductive layers in such a way as to fill up recesses formed inside the respective holes by the respective third insulating layers with the corresponding third highly electroconductive layers.

BRIEF DESCRIPTION OF THE DRAWINGS

The foregoing and other objects and advantages of the present invention will be seen by reference to the description, taken in connection with the accompanying drawings, in which:

FIG. 4 is a schematic fragmentary cross-sectional view of an example of the memory cell array structure of the present invention, which is taken along line I—I of FIG. 5;

FIG. 5 is a schematic plan view corresponding to FIG. 4;

FIGS. 6 and 7 are schematic cross-sectional view taken along lines II—II and III—III, respectively, of FIG. 4;

FIGS. 8a to 8k are schematic fragmentary cross-sectional views of major structures, which are illustrative of an example of the process for producing a memory cell array structure according to the present invention.

DETAILED DESCRIPTION OF PREFERRED EMBODIMENTS

Figure 3:
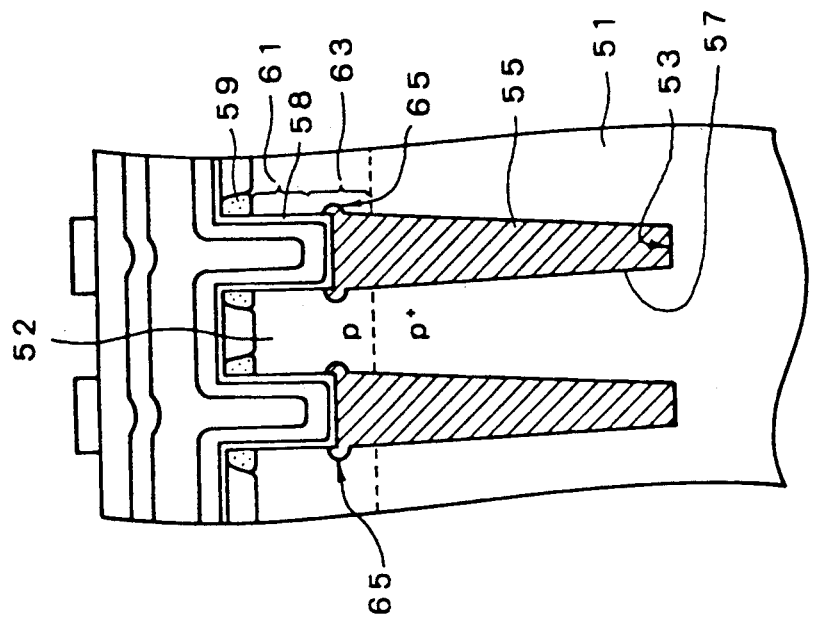
FIGS. 2 and 3 are schematic fragmentary cross-sectional views of memory cell array structures, which are illustrative of other conventional techniques.
Figure 1:
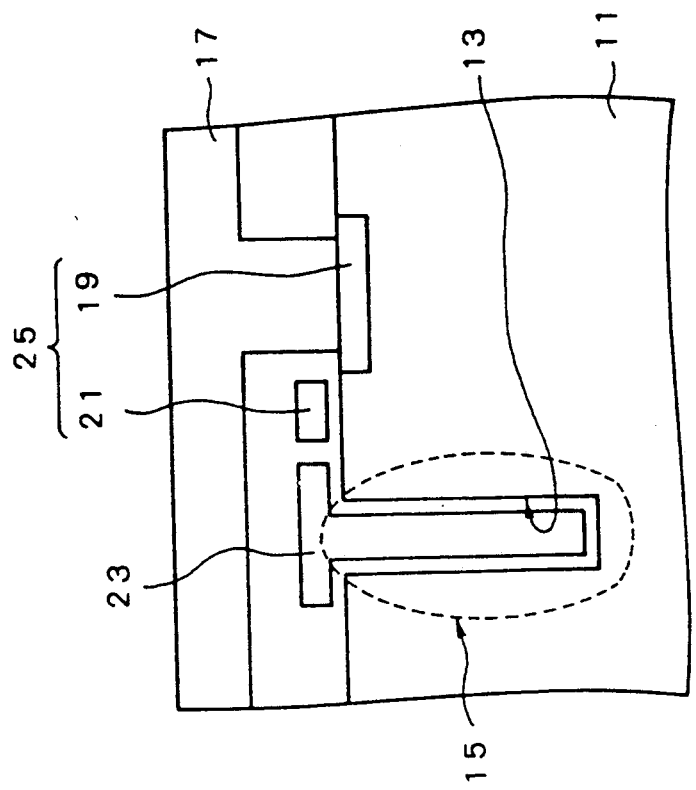
FIG. 1 is a schematic cross-sectional view of a memory cell structure, which is illustrative of a conventional technique.
Figure 2:
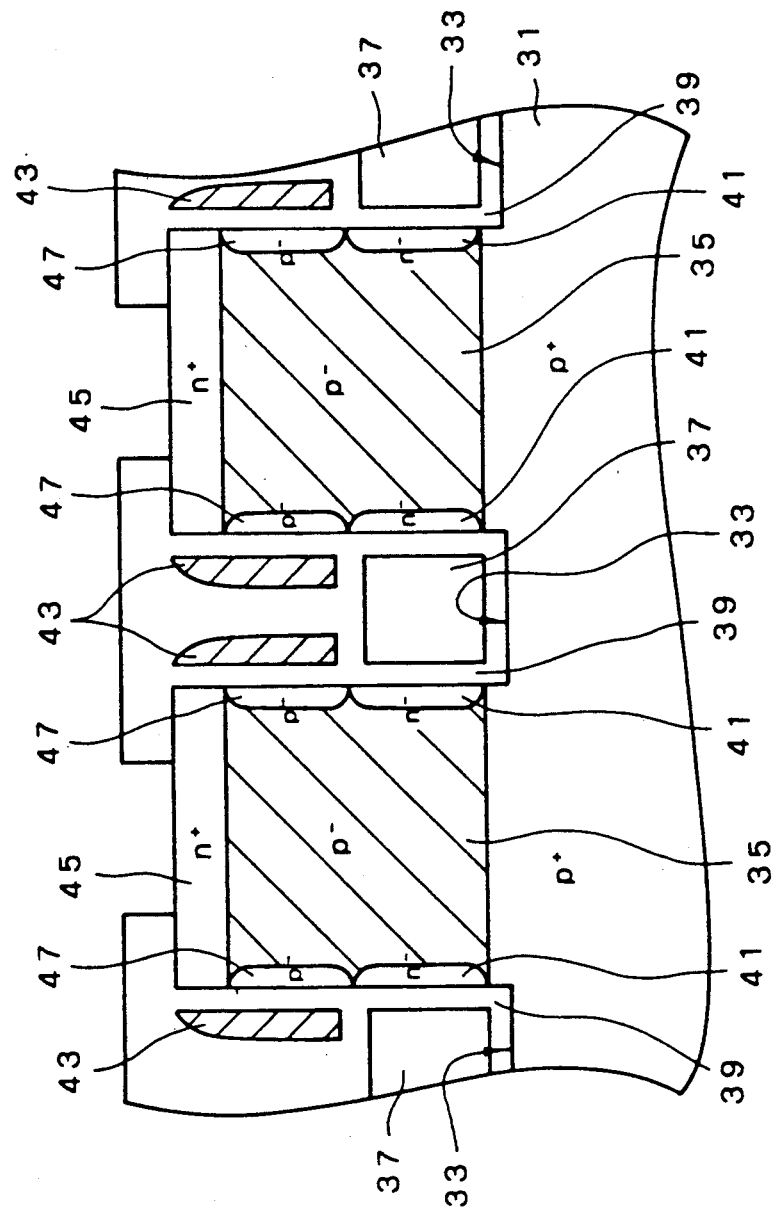

A description will now be made of examples of the memory cell array structure of the present invention as well as the process for producing the same according to the present invention while referring to the accompanying drawings, which are however, drawn so schematically as to simply facilitate the understanding of the present invention. Thus, the dimensions, shapes, etc. appearing in the drawings should not be construed as limiting the scope of the present invention.

Description of Memory Cell Array Structure

FIG. 4 is a schematic fragmentary cross-sectional view of an example of the memory cell array structure of the present invention, which is taken along line I—I of FIG. 5. FIG. 5 is a plan view of the example, shown in FIG. 4, of the memory cell array structure of the present invention. FIGS. 6 and 7 are schematic cross-sectional views of the example shown in FIG. 4, which are taken along lines III—III and IV—IV, respectively, of FIG. 4. Incidentally, hatching to indicate cross sections, and the like are partially omitted in these figures. The outline of this memory cell array structure will be described with focusing on a memory cell thereof while referring to these figures.

In FIG. 4, a semiconductor substrate 71 is a low electric resistance semiconductor substrate of first conductivity type. In this example, the substrate is a $p^+$-type single crystal silicon substrate 71 (hereinafter sometimes referred to in brief as a "substrate").

The memory cell array structure includes bit lines 73 and word lines 75. Reference will be made to first, second, third, and fourth electrodes, and it will be seen that these include the bit line and word line.

An described hereinbefore, each memory cell comprises a switching element portion and a capacitor portion. In the present invention, each memory cell is formed by utilizing an insular semiconductor layer 77 provided between the substrate 71 and a bit line 73 and a word line 75. The insular semiconductor layer 77 is provided as an individual or independent region substantially under an intersectional area of the bit line 73 and the word line 75, and comprises a plurality of necessary layers constituting part of a switching element portion 95 as will be described later and a necessary layer constituting part of a capacitor portion 93 as will be described later. Such insular semiconductor layers 77 having, for example, a substantially quadrate contour as represented by a broken line in FIG. 5 are disposed at substantially regular intervals.

An insulating layer 91 is provided on the peripheral side walls of insular semiconductor layer 77 and on the grooved surface of the substrate 71 around the areas thereof just under the insular semiconductor layers 77, which are embedded substantially up to the tops thereof in a layer constituting the second electrode 79 of capacitor portions (see FIG. 4). Thus, the second electrode 79 has a continuous and integral structure not only to constitute such a common electrode of the capacitor portions as to electrically connect memory cells with one another, but also to serve as such a separatory region as to separate the insular semiconductor layers 77 constituting parts of the respective memory cells from one another (see FIGS. 5 to 7).

Since the memory cells are formed by utilizing the respective insular semiconductor layers 77 as described above, the sphere of one memory cell covers, for example, an area 81 surrounded by the dotted line in FIG. 5.

A more detailed description of the foregoing memory cell array structure will now be made while referring to FIGS. 4 to 7. Each insular semiconductor layer 77 provides a cross section, vertical to the reverse surface of the substrate 71, having a hole 97 in a region under around the center of the intersectional area of a bit line and a word line 75 as shown in FIG. 4. An insulating layer 99 is provided on the inner wall face of the hole 97 in such a way as to form an inside recess surrounded thereby, which is filled up with the word line 75 (fourth electrode). Thus, the top face of the insular semiconductor layer 77 just under the bit line 73, when seen in parallel with the reverse surface of the substrate 71, surrounds a part of the word line 75 inside the hole 97 through the insulating layer 99 therebetween.

Each insular semiconductor layer 77 is constituted a lower electric of resistance semiconductor layer 83 of second conductivity type, a high electric resistance semiconductor layer 85 of first conductivity type, and an upper low electric resistance semiconductor layer 87 of second conductivity type (low electric resistance region) which are formed in this order on the p+-type single crystal silicon substrate 71. In this example, the under low electric resistance semiconductor layer 83 of second conductivity type is an n+-type single crystal silicon layer, the high electric resistance semiconductor 85 of first conductivity type is a p−-type single crystal silicon layer, and the upper low resistance semiconductor layer 87 of second conductivity type is an n+-type single crystal silicon layer. The low electric resistance semiconductor layer 83 ranges from the upper surface of the substrate 71 to at least the bottom of the hole 97. The high electric resistance semiconductor layer 85 constitutes a lower side wall portion of the hole 97 and the upper low electric resistance semiconductor layer 87 constitutes an upper side wall portion of the hole 97.

The capacitor portion 93 of each memory cell comprises first and second electrodes. The above-mentioned n+-type single crystal silicon layer 83 works as the first electrode in cooperation with the aforementioned second electrode 79, which is provided in such a way as to confront at least the whole peripheral side wall face of the first electrode 83, and, in other words, surround the first electrode 83 except for the lower and upper surfaces thereof, as described hereinbefore. The capacitor portion 93 further comprises the aforementioned insulating layer 91 to electrically insulate the second electrode 79 from first electrode 83 and the substrate 71.

Additionally stated, the upper surface of the second electrode 79 opposite to the substrate 71 is covered with an insulating layer 101. The second electrode 79 is preferably made of a high melting point metallic material such as polycrystalline silicon having a high impurity or dopant concentration, a silicide having impurity or dopant concentration, or tungsten. When the second electrodes 79 are made of such a metallic material having a low electric resistance, there does not occur an interaction between the memory cells, which would otherwise be caused by a difference in the voltage (applied to memory cell) between the memory cells. The insulating layer 91 constitutes an electric charge storing region. Accordingly, this should be given a due consideration in determining the thickness of the insulating layer 91.

Meanwhile, the switching transistor portion 95 of each memory cell in this example has a structure as will now be described.

As already described, the aforementioned insular semiconductor layer 77 has the hole 97 located substantially in the central area thereof and having a depth ranging from the surface of the bit line 73 (third electrode) to the first electrode 83, which hole 97 is covered with the insulating layer 99 on the inner wall thereof to leave an inside recess which is filled with the word line 75. In this case, the length $l_1$, $l_2$, $m_1$ and $m_2$ as shown in the plan view of FIG. 5 are set as follows. In the sphere 81 of one memory cell, various regions constituting the memory cell will now be considered. The length $l_1$ refers to a distance between the left contour face, in FIG. 5, of the insular semiconductor layer 77 and the lower lateral border face of the word line 75 with the insulating layer 99 formed on the left inner side wall, in FIG. 5 of the hole 97. The length $l_2$ refers to a distance between the right contour face, in FIG. 5, of the insular semiconductor layer 77 and the lower lateral border face of the word line 75 with the insulating layer 99 formed on the right inner side wall, in FIG. 5, of the hole 97. The line $m_1$ refers to a distance between the upper contour face, in FIG. 5 of the insular semiconductor layer 77 and the lower lateral border face of the word line 75 with the insulating layer 99 formed on the upper inner side wall, in FIG. 5, of the hole 97. The length $m_2$ refers to a distance between the under contour face, in FIG. 5, of the insular semiconductor layer 77 and the lower lateral border face of the word line 75 with the insulating layer 99 formed on the under inner side wall, in FIG. 5 of the hole 97. In the designing of this example, $l_1 \approx l_2$ and $m_1 \approx m_2$.

In this example, the switching element portion 95 (see FIG. 4) has a structure comprising the word line 75 as a gate electrode 75, the under n+-type single crystal silicon layer 83 (first electrode 83 of the capacitor portion 93) as a source electrode 83, the upper n+-type single crystal silicon layer 87 (constituting part of the side wall of the hole 97) as a drain region 87 (drain electrode), and the p−-type single crystal silicon layer 85 (part of the insular semiconductor layer 77 between the source electrode 83 and the drain electrode 87) to form a p−-type channel region. Thus, this switching element portion 95 has the source electrode 83 constituted of the first electrode 83 of the capacitor portion 93, on the upper side of which the channel region 85, the drain electrode 87, and the gate electrode 75 (word line) are provided. In this switching element portion 95, the p−-type single crystal silicon layer 85 constituting part of the side wall of the hole 97 has an inner side face portion (adjoining the insulating layer 99), wherein an n-type inversion layer, namely a channel, is formed or disappears in response to a level of voltage applied to the word line 75 (gate electrode) to thereby carry out an on-off operation.

A number of memory cells each having such respective switching element portions 95 and respective capacitor portions 93 are disposed in respective intersectional areas of word lines 75 and bit lines 73 with the respective first electrodes 83 (lower low electric resistance semiconductor layer of second conductivity type) provided below the above-mentioned areas and being common to the respective switching element portions 95 and the respective capacitor portions 93 to constitute a memory cell array structure.

In the memory cell array structure of the foregoing example, the second electrode 79 is slightly embedded in the low electric resistance semiconductor substrate 71 through the insulating layer 91 therebetween and is electrically insulated from the first electrodes 83 of the memory cells with the insulating layer 91 to thereby decrease electric current leakage between the memory cells.

Further, it can be noted that the use of the low electric resistance semiconductor substrate 71 may make soft errors, attributable to cosmic rays or the like, hard to occur.

Description of Process for Producing Memory Cell Array Structure

A description will now be made of an example of the process for producing a memory cell array structure according to the present invention with reference to FIGS. 8a to 8k to simultaneously facilitate the understanding of the memory cell array structure of the present invention.

FIGS. 8a to 8k are schematic fragmentary cross-sectional views of major structure obtained in major steps of this example of the process for producing a memory cell array structure according to the present invention, and are drawn so schematically as to simply facilitate the understanding of the present invention. In these figures, hatching to indicate cross sections, and the like are partially omitted. Needless to say, the scope of the present invention is not limited to various conditions such as the shapes, sizes and positional relationship of various constituents of those major structures as mentioned in this example and as shown in FIGS. 8a to 8k.

First, a low electric resistance semiconductor substrate 200 of first conductivity type to be used in the process is a p$^+$-type single crystal silicon substrate doped with boron as an impurity or dopant in a concentration of about $10^{17}$ to $10^{19}$ atoms/cm$^3$. An n$^+$-type single crystal silicon layer 202 having a concentration of an impurity or dopant having a valence of V, such as phosphorus, antimony or arsenic, of about $10^{17}$ to $10^{19}$ atoms/cm$^3$ and a thickness of about 3 to 4 μm is grown as a low electric resistance semiconductor layer 202 of second conductivity type on the upper surface of the substrate 200, for example, according to epitaxial growth. Subsequently, a p$^-$-type single crystal silicon layer 204 having a concentration of boron as an impurity or dopant of about $10^{14}$ to $10^{18}$ atoms/cm$^3$ and having a thickness of about 1 to 2 μm is epitaxially grown as a high electric resistance semiconductor layer 204 of first conductivity type on the low electric resistance semiconductor layer 202 to form a structure as shown in FIG. 8(a).

Subsequently, a first trench 206 having a depth ranging from the upper surface of the high electric resistance semiconductor layer 204 to at least the upper surface of the substrate 200 is formed using photolithographic and etching techniques in such matrix fashion as to run in longitudinal and lateral directions as projected on the reverse surface of the substrate 200 to thereby form a structure having a plurality of insular isolated regions 208 as shown in FIG. 8(b). The insular isolated regions are predominantly comprised of the remaining low electric resistance semiconductor layers 202 and the remaining high electric resistance semiconductor layers 204 Each remaining low electric resistance semiconductor layer 202 in an insular isolated region 208 constitutes a first electrode of a capacitor portion as will be described later.

Thereafter, any damage caused to the substrate 200 in the step of formation of the first trench 206 is sufficiently recovered or eliminated by a suitable method such as annealing or wet etching.

Subsequently, a first insulating layer 210 is formed at least on the wall face of the first trench. Since the insular isolated regions 208 and the substrate 200 are all made of single crystal silicon in this example, a wall face portion of the first trench 206 and the upper surface portions of the remaining high electric resistance semiconductor layers 204 are oxidized to form an oxide layer as the first insulating layer 210. The thickness of the first insulating layer 210 is, for example, about 50 to 200 Å. In this step, a second trench 212 corresponding to the first trench 206 is formed by the first insulating layer 210 (see FIG. 8(c)). A portion of the first insulating layer 210 constituting a substantial part of the side wall of the second trench 212 mainly works as the electric charge storing regions of all capacitor portions.

Subsequently, a first preparatory electroconductive layer 214 is formed on the whole surface of first insulating layer 210 in such a way as to not only fill up therewith the second trench 212 but also planarize the whole upper surface thereof. In this example, a high impurity or dopant concentration polycrystalline silicon layer doped with an impurity or dopant such as boron or phosphorus in a concentration of about $10^{19}$ atoms/cm$^3$ is deposited as the first preparatory electroconductive layer 214 according to a suitable technique such as a CVD method to form a structure as shown in FIG. 8(d).

Thereafter, the first preparatory electroconductive layer 214 is etched back, for example, by anisotropic etching with the first insulating layer 210 as an etch stop to be partially removed from the structure to such a depth as to recede to one-half way along the side face of the high electric resistance semiconductor layer 204. According to the foregoing procedure, a first highly electroconductive layer 216 is formed in the second trench from the first preparatory electroconductive layer 214 to form a structure as shown in FIG. 8(e). Additionally stated, the formation of the first highly electroconductive layer 216 may be done according to an alternative procedure comprising the step of forming a first insulating layer 212 as mentioned before only on the wall face of the first trench 206, the step of depositing a first preparatory electroconductive layer 214 as mentioned above in the second trench 212 formed by the first insulating layer 212 as well as on the remaining high electric resistance semiconductor layers 204, and the step of etching back the first preparatory electroconductive layer 214, for example, by an anisotropic etching with the remaining high electric resistance semiconductor layers 204 as etch stops. The upper surface of the first highly electroconductive layer 216 is set to be in a level with a position of, for example, about 2,000 to 3,000 Å deep from the upper surface of the remaining high electric resistance semiconductor layers 204. The first highly electroconductive layer 216 thus formed constitutes the second electrodes 216 of all the capacitor portions, which electrodes 216 are electrically insulated from the first electrodes 202 with the first insulating layer 210 and surround the first electrodes 202 with the first insulating layer 210 therebetween in such a way as to confront the whole side faces of the first electrodes 202.

Subsequently, a preparatory insulating layer 220 to be formed into a second insulating layer 218 is formed on the first highly electroconductive layer 216 in the second trench 212 and on the first insulating layer 210 in such a way as to planarize the whole upper surface thereof to thereby form a structure as shown in FIG. 8(f). Additionally stated, in the case where the first insulating layer 210 is not formed on the remaining high electric resistance semiconductor layers 204, the preparatory insulating layer 220 is formed on the first highly electroconductive layer 216 and on the remaining high electric resistance semiconductor layers 204. A silicon oxide film is formed as the preparatory insulating layer 220, for example, by a CVD method.

Subsequently, etching back is effected from the upper surface of the preparatory insulating layer 220 to the level of the upper surfaces of the high electric resistance semiconductor layers 204, for example, according to anisotropic etching with the high electric resistance semiconductor layers 204 acting as etch stops to thereby form the second insulating layer 218 consisting of the remaining preparatory insulating layer 220 in the upper portion of the second trench 212. Thus, a structure as shown in FIG. 8(g) is obtained, which has a planar whole upper surface including the upper surfaces of the remaining high electric resistance semiconductor layers 204 and the upper surface of the second insulating layer 218.

Subsequently, second highly electroconductive layers 222 are formed in striped fashion on areas of the planar upper surface including at least substantial areas of the upper surfaces of the insular isolated regions 208 in rows between the lines in one direction of the matrix. In this example, the second highly electroconductive layers 222 are formed according to the following procedure. First, a polycrystalline silicon layer doped with an impurity or dopant such as phosphorus or arsenic in a high concentration of about $10^{19}$ atoms/cm$^3$ is deposited as a second preparatory electroconductive layer (not shown in any figures) on the planar whole upper surface of the structure as shown in FIG. 8(g), for example, according to a CVD method. Thereafter, the second preparatory electroconductive layer is subjected to patterning using a customary photoetching technique to form the striped second highly electroconductive layers 222 (see FIG. 8(h)). These second highly electroconductive layers 222 will later be formed into third electrodes 222, namely bit lines 222.

Subsequently, a fourth insulating layer(s) 224 is formed, for example, by a CVD method to cover at least the striped second highly electroconductive layers 222 or the whole upper surface including the surface of the second highly electroconductive layers 222 to thereby form a structure as shown in FIG. 8(h). In this step, it is preferably that the thickness of the fourth insulating layer(s) 224 be relatively large for the purpose of lowering the parasitic capacity between the bit lines 222 and word lines 234 which will later be formed in intersection with the bit lines 222.

Subsequently, holes 226 having a depth ranging from the upper surface of the fourth insulating layer 224 to at least the upper surface of the remaining low electric resistance semiconductor layer 202 are formed into the respective insular isolated regions 208. In this example, a photolithographic and etching techniques are preferably used to form the hole 226 having a depth ranging from the upper surface of the fourth insulating layer 224 to at least the upper surface of the low electric resistance semiconductor layer 202, for example, substantially around the centers in plan of the respective insular isolated regions 208. The resulting structure is as shown in FIG. 8(i).

Thereafter, any damage caused to the above-mentioned structure by the formation of the holes 226 is recovered using a suitable technique such as annealing or wet etching.

Subsequently, third insulating layers 228 are formed on the wall faces of the respective holes 226 according to a suitable method. Since the layers of the insular isolated regions 208 are made of single crystal silicon in this example, the single crystal silicon is thermally oxidized by a heat treatment to form silicon oxide layers 228 as the third insulating layers 228. In this step, recesses 230 corresponding to the respective holes 226 are formed by the respective third insulating layers 228. The resulting structure is as shown in FIG. 8(j). The thickness of the third insulating layers 228 is preferably about 100 to 200 Å. A third insulating layers 228 thus formed work as the gate insulating layers of switching element portions.

In this example, the impurity or dopant, such as phosphorus or arsenic, contained in the second highly electroconductive layers 222 is diffused, according to solid phase diffusion, into upper surface portions of the remaining high electric resistance semiconductor layers 204 under and in contact with the corresponding second highly electroconductive layers 222 during the course of the heat treatment for the formation of the silicon oxide layers 228 to convert the upper surface portions of the remaining high electric resistance semiconductor layers 204 into n+-type regions 232 of second conductivity type having a high impurity or dopant concentration and a low electric resistance. The depth of these n+-type regions 232 may range from the upper surface thereof to such a level as to leave at least part of the remaining high electric resistance semiconductor layers 204 in so far as it does not reach the level of the upper surface of the first highly electroconductive layer 216 formed in the second trench 212.

As a result of the formation of the recsses 230 in the respective insular isolated regions 208 according to the above-mentioned procedure, each of the resulting insular semiconductor layers 240 comprises the respective remaining low electric resistance semiconductor layers 202 and the respective remaining high electric resistance semiconductor layers 204, and the respective low electric resistance regions 232 (n+-type regions).

Subsequently, third highly electroconductive layers 234 are formed in striped fashion on areas of the uppermost surface everywhere positioned on the upper side of at least parts of the areas in plan of the insular isolated regions 208 in columns between the lines in the other direction of the matrix. The third highly electroconductive layers 234 are electrically insulated from the second highly electroconductive layers 222 with the fourth insulating layer(s) 224 therebetween. The formation of the striped third highly electroconductive layers 234 is done in such a way as to fill up therewith the aforementioned recesses 230 in the corresponding columns. In this example, a polycrystalline silicon layer doped with an impurity or dopant such as phosphorus or arsenic in a high concentration of about $10^{19}$ atoms/cm$^3$ is formed on the whole uppermost surface everywhere including the upper surface(s) of the fourth insulating layer(s) 224 and the surfaces of the third insulating layers 228 including the wall faces of the recesses 230, for example, according to a CVD method, and is then subjected to patterning using a photoetching technique to form the third highly electroconductive layers 234. These third highly electroconductive layers 234 work as the word lines 234. According to the foregoing process, a memory cell array structure as shown in FIG. 8(k) is obtained, which has substantially the same structure as shown in FIG. 4.

Additionally stated, in the memory cell array structure as shown in FIG. 8(k), the capacitor portion of each memory cell comprises a low electric resistance semiconductor layer 202 of second conductivity type (first electrode), part of the insulating layer 210, and part of the first highly electroconductive layer 216 (second electrode), while the switching element portion of each memory cell comprises a low electric resistance semiconductor layer 202 of second conductivity type as a source region, part of a high electric resistance semiconductor layer 204 of first conductivity type as a channel region, a low electric resistance region 232 of second conductivity type as a drain region, and part of a third highly electroconductive layer 234 (word line) as a gate electrode.

As will be apparent from the foregoing example of the process of the present invention, the memory cell array structure of the present invention can be produced using only relatively simple techniques with advantages including the formation of drain regions in self-alignment fashion to enable the number of photomasks to be decreased. Thus, the present invention can easily be mass produced. Further, when the width of patterned lines is set to be 0.6 $\mu$m, the area in plan of one memory cell of the resulting memory cell array structure as shown in FIGS. 4, 5 and 8k is as small as 5.76 $\mu$m$^2$.

Additionally stated, it should be understood that the process of the present invention is not limited to the foregoing example, and that any methods can be used in so far as they can produce the memory cell array structure of the present invention. For instance, while the low electric resistance semiconductor layer (n$^+$-type single crystal silicon layer 202) to be formed into the first electrodes is formed by epitaxial growth in the foregoing example, formation of such a layer may alternatively be done by diffusion of a suitable impurity or dopant into a substrate 200. High melting point metals and silicides can, of course, be used as the material of bit lines 222 and word lines 234. Further, while the formation of the low electric resistance regions (n$^+$-type regions 232 of single crystal silicon) is done by solid phase diffusion of the impurity or dopant contained in the bit lines 222 into the upper surface portions of the high electric resistance semiconductor layers (p$^-$-type single crystal silicon layers 204) in the foregoing example, formation of such layers may alternatively be done by ion implantation. Further, the solid phase diffusion for the formation of the above-mentioned low electric resistance region 232 is done by the heat treatment for the formation of the third insulating layer 228 in the foregoing example, but this is not limitative. For example, the second preparatory electroconductive layer (polycrystalline silicon layer) formed on the planar whole surface (see FIG. 8(g)) obtained after the formation of the second insulating layer 218 may alternatively be subjected to a thermal oxidation treatment to effect solid phase diffusion of an impurity or dopant contained in the second preparatory electroconductive layer into upper surface portion of the remaining high electric resistance layers 204 to thereby form low electric resistance regions as mentioned above. Additionally stated, in this case, since an upper surface portion of the above-mentioned second preparatory electroconductive layer is thermally oxidized to form an insulating layer corresponding to the aforementioned fourth insulating layer(s) 224, the former insulating layer and the remaining preparatory electroconductive layer may be subjected to patterning to simultaneously form the second highly electroconductive layer 222 and the fourth insulating layers 224.

Another Example of Memory Cell Array Structure

Another example of the memory cell array structure of the present invention will now be described.

In the aforementioned examples, each hole 97, 226 having therein an inside recess filled up with a word line 75, 234 is provided substantially in a central portion in plan of an insular semiconductor layer 77, 240, with $l_1 \approx l_2$ and $m_1 \approx m_2$ as shown in FIG. 5. However, the position in plan of such a hole 97 may be altered as follows.

Although an area specified by $m_1$ and $m_2$ is necessary as an area wherein a bit line 73, 222 running through a plurality of memory cells is electrically connected with upper low electric resistance semiconductor layers 87, 232 (low electric resistance regions) in those respective memory cells, the condition of $m_1 \approx m_2$ is not always necessary in so far as such electric connection can be secured. It will be easily understood that it will suffice even if any condition of $m_1 \neq m_2$ is set or even if either one of $m_1$ and $m_2$ is set to zero. In such a case, no consideration needs to be given to room or tolerance for registration or alignment of insular semiconductor layers 77, 240 with bit lines 73, 222 in the direction of $m_1$ and $m_2$. Therefore, not only can the size in this direction of the memory cells decreased by such room which would otherwise be necessary, but also the production of memory cell array structure can be facilitated.

An area specified by $l_1$ and $l_2$ can be very small. When the lengths $l_1$ and $l_2$ are decreased, not only can the size of memory cells in the direction of $l_1$ and $l_2$ be decreased, but also the formation of holes 97, 226 can be done in self-alignment fashion with the second insulating layer 101, 218 as a mask.

Figure 9:
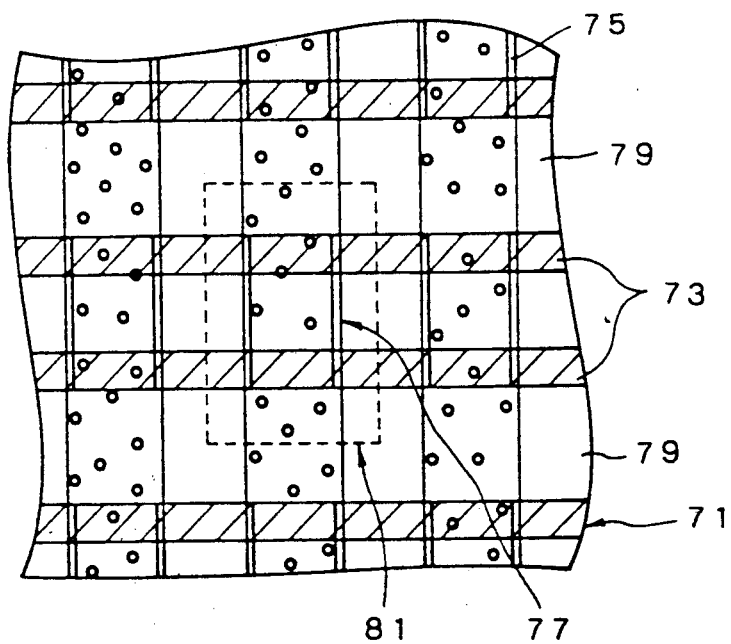
FIG. 9 is a schematic fragmentary plan view of another example of the memory cell array structure of the present invention.

FIG. 9 is a plan view of an example of the memory cell array structure of the present invention wherein the lengths $l_1$ and $l_2$ with $l_1 \approx l_2$ are set such as to provide substantially minimum permissible room or tolerance for registration or alignment of word lines 75, 234 with holes 97, 226 to be filled up with the word lines 75, 234 and a condition of $m_1 \approx m_2$ is set. In such a case, the area occupied by one memory cell 81 as projected on the reverse surface of a substrate is smaller. Thus, for example, when the width of word lines is set to be 0.6 $\mu$m, the area in plan of one memory cell can be as smaller as 2.52 μm².

The forms in plan of the insular semiconductor layers 77, 240 and the holes 97, 226 filled up with the word lines 75, 234 are both quadrilateral in the foregoing example, but this is not limitative. Thus, suitable forms in plan of such layers and such holes can be chosen according to the designing of a memory cell array structure.

As will be apparent from the foregoing description, the following effects can be achieved according to the present invention.

Since the area of a substrate occupied by one memory cell can be very small, a memory cell array structure having memory cells packaged therein at a high density can be obtained.

A memory cell array structure involving little difference in the capacitor capacity between memory cells can be obtained.

Since switching element portions are constituted of a transistor of insulated gate type, the input impedance of a memory cell array structure can be increased to thereby achieve a low electric power consumption.

Since the channel length can be determined by the thickness of high electric resistance semiconductor layers of first conductivity type, the operational characteristics of switching element portions can be made uniform therebetween.

What is claimed is:

1. A process for producing a memory cell array comprising the steps of:
   establishing, above a semiconductor substrate of a first conductivity type, a first semiconductor layer of a second conductivity type and a second semiconductor layer of the first conductivity type above said first semiconductor layer;
   defining trenches in said first semiconductor layer, each said trench having a first interior surface;
   covering said first interior surfaces with a first insulating layer having a second interior surface so that portions of said first semiconductor layer remaining after said defining step provide first electrodes which confront said second interior surface through said first insulating layer;
   filling, at least partially, said trenches with a conductive material to establish second electrodes in said trenches;
   establishing a third semiconductor layer of the second conductivity type above said second semiconductor layer and a further insulating layer above the third semiconductor layer, said third semiconductor layer and said further insulating layer extending across said trenches;
   defining holes through said third semiconductor layer and said further insulating layer, said holes being displaced from said trenches, said holes having second interior surfaces;
   insulating said second interior surfaces with further insulation;
   creating a conductive region of said second conductivity at an upper portion of said second semiconductor layer; and
   filling, at least partially, said holes with a conductive material.

2. The process of claim 1 wherein said step of defining trenches includes defining trenches which extend through said first and second semiconductor layers so that said first electrode confronts the entire first interior surface.

3. The process of claim 1 including the step of extending said second electrodes into an inner portion of said substrate.

4. The process of claim 1 including the step of extending said second electrodes into a portion of said substrate under the surface of said substrate.

5. The process of claim 1 including the step of extending said conductive material into a portion of said first semiconductive layer under the top surface of said first semiconductor layer.

6. The process of claim 1 wherein said step of filling said trenches includes establishing a layer of said conductive material in said trenches and above said second semiconductive layer, removing a top portion of said conductive material to expose the top of said trenches, and planarizing the tops of said trenches with the upper surface of said second semiconductor layer.

7. The process of claim 6 wherein said filling step occurs prior to said step of establishing a third semiconductor layer.

8. The process of claim 7 wherein said planarizing step includes arranging said conductive material to have a top surface that is below the top of said trenches, adding preparatory insulation upon said top surface of the conductive material and over said second semiconductor layer, and etching back said preparatory insulation and upper portions of said first insulating layer to expose the top surfaces of said second semiconductor layer adjacent to said trenches.

9. A method of forming a memory cell array for a semiconductor memory which includes bit lines orthogonal to word lines, comprising the steps of:
   forming first, second, third, and fourth layers of semiconductor material, said first and third layers having one type of conductivity;
   forming a plurality of reticulated electrode regions extending through said second, third and fourth layers, including partially filling each said electrode region with a conductive material to serve as an electrode, locating insulation therein to isolate the conductive material from side walls and bottom wall of the electrode regions, and locating insulation on top of said conductive material thereby to fill said regions and to insulate materials located over said regions from said conductive material;
   locating said bit lines over said electrode regions insulated from said conductive material by said insulation on top of sid conductive material; and
   establishing a plurality of holes shallower than said electrode regions, said holes extending through said third and fourth layers, including filling each said hole with a conductive material to serve as the word line and second insulation to insulate the word line conductive material from the side and bottom walls of said holes, said second insulation insulating said word lines from said bit lines, locating said holes and electrode region so that portions of said third layer and said fourth layer are disposed between said electrode regions and said holes.

10. The process of claim 9 wherein said second and fourth layers are established with other type of conductivity than said first and third layers; said first, second and fourth layers is provided with low resistivity; and said third layer has a higher resistivity.

11. A process for producing a memory cell array structure, comprising the steps of:
  (a) forming a low electric resistance semiconductor layer (202) of second conductivity type and a high electric resistance semiconductor layer (204) of first conductivity type above a low electric resistance semiconductor substrate (200) of first conductivity type;
  (b) forming a first trench (206) having a depth ranging from the upper surface of said high electric resistance semiconductor layer (204) to at least the upper surface of said substrate (200) in matrix fashion to thereby form a plurality of insular isolated regions (208) of the remaining layers of the two types;
  (c) forming a first insulating layer (210) on the wall face of said first trench (206) to form a second trench (212) corresponding to the first trench (206);
  (d) filling said second trench (212) with a first electroconductive layer (216) to such a height as to reach the height of the remaining high electric resistance semiconductor layers (204);
  (e) forming a second insulating layer (218) on said first electroconductive layer (216) in said second trench (212) to level the upper surface thereof with the upper surfaces of said remaining high electric resistance semiconductor layers (204) thereby to provide a planar whole upper surface including the upper surfaces of said remaining high electric resistance semiconductor layers and the upper surface of said insulating layer (218);
  (f) forming horizontal stripes of second electroconductive layers (222) over areas of said planar upper surface including at least substantial areas of the upper surface of said remaining high electric resistance semiconductor layers (204) in rows between the lines in one direction of the matrix;
  (g) forming in said insular isolated regions (208) respective holes (226) having a depth ranging from the upper surfaces of said second electroconductive layers (222) to at least the upper surfaces of the respective remaining low electric resistance semiconductor layers (202);
  (h) forming third insulating layers (228) on the inner wall faces of said respective holes (226) to form recesses (230) corresponding the respective holes (226);
  (i) converting surface portions of said remaining high electric resistance semiconductor layers (204) of first conductivity type in said respective insular isolated regions (208) into respective low electric resistance semiconductor regions (232) of second conductivity type; and
  (j) filling said recesses (230) with third electroconductive layers (234) being in horizontal stripes located on areas of the uppermost surface everywhere positioned on the upper side of said insular isolated regions (208) in columns between the lines in the other direction of the matrix through a fourth insulating layer(s) (224) therebetween electrically insulating said third remaining second electroconductive layers (222).

12. The process of producing a memory cell array structure as claimed in claim 11, wherein said step (c) comprises the substep of:
  (c-i) forming said first insulating layer (210) on the wall face of said first trench (206) and on the upper surfaces of the remaining high electric resistance semiconductor layers (204); and
wherein said step (d) comprises the substeps of:
  (d-i) forming a first preparatory electroconductive layer (214) in said second trench (212) having a wall constituted of said first insulating layer (210) and on the upper surface areas of said first insulating film (210) formed on said remaining high electric resistance semiconductor layers (204) in such a way as to give a planar upper surface to said first preparatory electroconductive layer (214); and
  (d-ii) etching back said first preparatory electroconductive layer (214) with said first insulating layer (210) as an etching stopper to such a depth as to recede to half way along the side faces of said remaining high electric resistance semiconductor layers (204) to thereby form said first highly electroconductive layer (216).

13. The process for producing a memory cell array structure as claimed in claim 11, wherein said step (e) comprises the substeps of:
  (e-i) forming a preparatory insulating layer (220), to be formed into said second insulating layer (218), on the upper surface of said first electroconductive layer (216) in said second trench and on upper side of said remaining high electric resistance semiconductor layers (204); and
  (e-ii) etching back said preparatory insulting layer (202) with said remaining high electric resistance semiconductor layers (204) as etching stoppers to form said second insulating layer (218).

14. A process for producing memory cell array structure as claimed in claim 11, wherein the formation in said step (i) of sid low electric resistance semiconductor regions (232) of second conductivity type is effected by a heat treatment used for the formation of said third insulating layers (228) in said step (h) to effect solid phase diffusion of an impurity or dopant contained in said second electroconductive layers (222) into said remaining high electric resistance semiconductor layers (204) to thereby simultaneously complete said steps (h) and (i).

15. A process for producing a memory cell array structure as claimed in claim 11, wherein the formation in said step (i) of said low electric resistance semiconductor regions (232) and the formation of said fourth insulating layer(s) (224) mentioned in said step (j) are effected by a procedure comprising the substep of forming a second preparatory electroconductive layer, to be formed into sid second electroconductive layers (222) in said step, on said planar whole upper surface provided in said step; and the substep of effecting a heat treatment to thermally oxidize an upper surface portion of said preparatory electroconductive layer to thereby form an oxide layer to be formed into said fourth insulting layers (224) while at the same time effecting solid phase diffusion of an impurity or dopant contained in said preparatory electroconductive layer into upper surface portions of the remaining high electric resistance semiconductor layers (204) to convert said upper surface portions of said (204) into said low resistance semiconductor regions (232).

16. A process for producing a memory cell array structure as claimed in claim 11, wherein the capacitor portion of each memory cell comprises one of said remaining low electric resistance semiconductor layers (202) of second conductivity type as a first electrode, part of said first electroconductive layer (126) as a second electrode, as part of said first insulating layer (210) as an electric charge storing region between said remaining low electric resistance semiconductor layer (202) and said first electroconductive layer (216); while the switching element portion of each memory cell comprises one of sid remaining low electric resistance semiconductor layers (202) of second conductivity type as a source region, part of one of said remaining high electric resistance semiconductor layers (204) of first conductivity type as a channel region, one of said low electric resistance semiconductor regions (232) of second conductivity type as a drain region, and part of one of said third highly electroconductive layers (234) as a gate electrode.

17. A process for producing a memory cell array structure, comprising the steps of;
   [a] sequentially forming a low electric resistance semiconductor layer (202) of second conductivity type and a high electric resistance semiconductor layer (204) of first conductivity type on the upper surface of a low electric resistance semiconductor substrate (200) of first conductivity type;
   [b] forming a first trench (206) having a depth ranging from the upper surface of said high electric resistance semiconductor layer (204) to at least the upper surface of said substrate (200) in matrix fashion to thereby form a plurality of insular isolated regions (208) of the remaining layers of the two types;
   [c] forming a first insulating layer (210) at least on the wall face of said first trench (206) to form a second trench (212) corresponding to the first trench (206);
   [d] forming a first highly electroconductive layer (216) in such a way as to fill up therewith the second trench (212), to such a height as to at least reach the height of the remaining high electric resistance semiconductor layers (204);
   [e] forming a second insulating layer (218) on said first highly electroconductive layer (216) formed in said second trench (212) to such a height as to set the upper surface thereof in a level with the upper surfaces of said remaining high electric resistance semiconductor layers (204) to thereby provide a planar whole upper surface including the upper surfaces of said remaining high electric resistance semiconductor layers and the upper surface of said insulating layer (218);
   [f] forming second highly electroconductive layers (222) in striped fashion on areas in plan of said planar upper surface including at least substantial areas of the upper surfaces of said remaining high electric resistance semiconductor layers (204) in rows between the lines in one direction of the matrix;
   [g] forming in said insular isolated regions (208) respective holes (226) having a depth ranging from the upper surfaces of said second highly electroconductive layers (222) to at least the upper surfaces of the respective remaining low electric resistance semiconductor layers (202);
   [h] forming third insulating layers (228) on the inner faces of said respective holes (226) to form recesses (230) corresponding the respective holes (226);
   [i] converting surface portions of said remaining high electric resistance semiconductor layers (204) of first conductivity type in said respective insular isolated regions (208) into respective low electric resistance semiconductor regions (232) of second conductivity type;
   [j] forming third highly electroconductive layers (234) in striped fashion on areas of the uppermost surface everywhere positioned on the upper side of at least parts of the areas in plan of said insular isolated regions (208) in columns between the lines in the other direction of the matrix through a fourth insulating layer(s) (224) therebetween electrically insulating said third highly electroconductive layers (234) from the remaining second highly electroconductive layers (222) in such a way as to fill up the recesses (230) with said corresponding third highly electroconductive layers (234).

18. A process for producing a memory cell array structure as claimed in claim 17, wherein said step [c] comprises the substep of:
   [c-i] forming said first insulating layer (210) on the wall face of said first trench (206) and on the upper surfaces of the remaining high electric resistance semiconductor layers (204); and
   wherein said step [d] comprises the substeps of:
   [d-i] forming a first preparatory electroconductive layer (214) in said second trench (212) having a wall constituted cf said first insulating layer (210) and on the upper surface areas of said first insulating film (210) formed on said remaining high electric resistance semiconductor layers (204) in such a way as to give a planar upper surface to said first preparatory electroconductive layer (214); and
   [d-ii] etching back said first preparatory electroconductive layer (214) with said first insulating layer (210) as an etching stopper to such a depth as to recede to half way along the side faces of said remaining high electric resistance semiconductor layers (204) to thereby form said first highly electroconductive layer (216).

19. A process for producing a memory cell array structure as claimed in claim 17, wherein said step [e] comprises the substeps of:
   e-i] forming a preparatory insulating layer (220), to be formed into said second insulating layer (218), on the upper surface of said first highly electroconductive layer (216) in said second trench and on upper side of said remaining high electric resistance semiconductor layers (204); and
   [e-ii] etching back said preparatory insulating layer (202) with said remaining high electric resistance semiconductor layers (204) as etching stoppers to form said second insulating layer (218).

20. A process for producing memory cell array structure as claimed in claim 17, wherein the formation in said step [i] of said low electric resistance semiconductor regions (232) of second conductivity type is effected by a heat treatment used for the formation of said third insulating layers (228) in said step [h] to effect solid phase diffusion of an impurity or dopant contained in said second highly electroconductive layers (222) into said remaining high electric resistance semiconductor layers (204) to thereby simultaneously complete said steps [h] and [i].

21. A process for producing a memory cell array structure as claimed in claim 17, wherein the formation in said step [i] of said low electric resistance semiconductor regions (232) and the formation of said fourth insulating layer(s) (224) mentioned in said step [j] are effected by a procedure comprising the substep of forming a second preparatory electroconductive layer, to be formed into said second highly electroconductive layers (222) in said step [f], on said planar whole upper surface provided in said step [e]; and the substep of effecting a heat treatment to thermally oxidize an upper surface portion of said preparatory electroconductive layer to thereby form an oxide layer to be formed into said fourth insulating layers (224) while at the same time effecting solid phase diffusion of an impurity or dopant contained in said preparatory electroconductive layer into upper surface portions of the remaining high electric resistance semiconductor layers (204) to convert said upper surface portions of said remaining high electric resistance semiconductor layers (204) into said low resistance semiconductor regions (232).

22. A process for producing a memory cell array structure as claimed in claim 17, wherein the capacitor portion of each memory cell comprises one of said remaining low electric resistance semiconductor layers (202) of second conductivity type as a first electrode, part of said first highly electroconductive layer (216) as a second electrode, and part of said first insulating layer (210) as an electric charge storing region between said remaining low electric resistance semiconductor layer (202) and said first highly electroconductive layer (216); while the switching element portion of each memory cell comprises one of said remaining low electric resistance semiconductor layers (202) of second conductivity type as a source region, part of one of said remaining high electric resistance semiconductor layers (204) of first conductivity type as a channel region, one of said low electric resistance semiconductor regions (232) of second conductivity type as a drain region, and part of one of said third highly electroconductive layers (234) as a gate electrode.

* * * * *